(12) United States Patent
Nomura et al.

(10) Patent No.: US 8,128,727 B2
(45) Date of Patent: Mar. 6, 2012

(54) METHOD FOR COLLECTING METAL

(75) Inventors: Ryoji Nomura, Kanagawa (JP); Satoshi Seo, Kanagawa (JP); Hideko Inoue, Kanagawa (JP); Kaoru Kato, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 529 days.

(21) Appl. No.: 11/939,003

(22) Filed: Nov. 13, 2007

(65) Prior Publication Data

US 2008/0261477 A1    Oct. 23, 2008

(30) Foreign Application Priority Data

Nov. 15, 2006   (JP) .................. 2006-308730

(51) Int. Cl.
*C22B 5/20*    (2006.01)
*H01J 9/50*    (2006.01)

(52) U.S. Cl. .............................. 75/416; 455/2

(58) Field of Classification Search ......... 445/2; 75/416
See application file for complete search history.

(56) References Cited

U.S. PATENT DOCUMENTS

| | | | |
|---|---|---|---|
| 5,252,305 A | 10/1993 | Ezawa et al. | |
| 5,332,420 A | 7/1994 | Cupertino et al. | |
| 5,364,452 A | 11/1994 | Cupertino et al. | |
| RE36,118 E | 3/1999 | Cupertino et al. | |
| 6,126,720 A * | 10/2000 | Okada et al. | 75/714 |
| 6,132,491 A * | 10/2000 | Wai et al. | 75/722 |
| RE36,990 E | 12/2000 | Cupertino et al. | |
| 6,632,113 B1 | 10/2003 | Noma et al. | |
| 6,951,494 B2 | 10/2005 | Noma et al. | |
| 2003/0196517 A1 | 10/2003 | Harada et al. | |
| 2005/0159068 A1 | 7/2005 | Noma et al. | |
| 2006/0213323 A1 | 9/2006 | Yamada et al. | |

FOREIGN PATENT DOCUMENTS

| | | |
|---|---|---|
| EP | 0 562 709 A2 | 9/1993 |
| EP | 1 354 646 A1 | 10/2003 |
| EP | 1 854 803 A1 | 11/2007 |
| JP | 4-317423 | 11/1992 |
| JP | 5-255771 | 10/1993 |
| JP | 6-17153 | 1/1994 |
| JP | 2003-73751 | 3/2003 |
| JP | 2003-301225 | 10/2003 |

(Continued)

OTHER PUBLICATIONS

Machine translation of JP 2003301225.*

(Continued)

*Primary Examiner* — Emily Le
*Assistant Examiner* — Rebecca Lee
(74) *Attorney, Agent, or Firm* — Husch Blackwell LLP

(57) ABSTRACT

It is an object of the present invention to collect a scarce metal such as iridium from a light-emitting element which is no longer used. A method for collecting a metal is provided in which an organic metal compound which can emit visible light from a triplet excited state at room temperature is heated, or an EL layer of a light-emitting layer containing an organic metal compound which can emit visible light from a triplet excited state at room temperature is dissolved in a solvent to form a solution, and the solution is heated, irradiated with microwaves or treated with acid water. According to the above method, resources of metals such as iridium or platinum, which are scarce metals, can be utilized efficiently.

12 Claims, 1 Drawing Sheet

FOREIGN PATENT DOCUMENTS

| | | |
|---|---|---|
| JP | 2004-882 | 1/2004 |
| JP | 2004-99975 | 4/2004 |
| JP | 2004-162082 | 6/2004 |
| JP | 2006-508250 | 3/2006 |
| JP | 2006-241077 | 9/2006 |
| WO | WO 95/04835 A1 | 2/1995 |
| WO | WO 2004/050926 A1 | 6/2004 |

OTHER PUBLICATIONS

Translated JP 2003301225, 2003.*

International Search Report re application No. PCT/JP2007/071866, dated Feb. 5, 2008.

Written Opinion re application No. PCT/JP2007/071866, dated Feb. 5, 2008.

Ma, Y. et al, "Triplet Luminescent Dinuclear-Gold(I) Complex-Based Light-Emitting Diodes with Low Turn-On Voltage," Applied Physics Letters, vol. 74, No. 10, Mar. 8, 1999, pp. 1361-1363.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.

Lamansky, S. et al, "Highly Phosphorescent Bis-Cyclometalated Iridium Complexes: Synthesis, Photophysical Characterization, and Use in Organic Light Emitting Diodes," Journal of the American Chemical Society, vol. 123, No. 18, May 9, 2001, pp. 4303-4312.

IUPAC Gold Book, http://goldbook.iupac.org, (2005-2009), p. C00840 (Carbonization).

* cited by examiner

METHOD FOR COLLECTING METAL

TECHNICAL FIELD

The present invention relates to a method for collecting a metal contained in an electroluminescent light-emitting element.

BACKGROUND ART

In recent years, research and development have been carried out actively for electroluminescent light-emitting elements. A basic structure of these light-emitting elements is that a light-emitting substance is sandwiched between a pair of electrodes. The application of voltage to this element enables the light-emitting substance to emit light.

Since such light-emitting elements are of a self-luminous type, they have advantages such as having higher visibility compared with liquid crystal displays and no need of back lights. Therefore, these light-emitting elements are suitable for flat panel display elements. Another significant advantage is that such light-emitting elements can be manufactured to be thin and light-weight. Another feature is that these light-emitting elements have extremely high response speed.

Since these light-emitting elements can be formed in a film form, planar light emission can easily be obtained by forming elements with large areas. Planar light emission is hard to obtain from point-light sources such as incandescent lamps and LEDs, or line sources such as fluorescent lights. Therefore, these light-emitting elements have a high utility value as surface illuminants. The surface illuminants can be applied to lighting and the like.

Electroluminescent light-emitting elements are largely classified into two types according to whether the light-emitting substance is an organic compound or an inorganic compound. Here the light-emitting substance which is the organic compound is described.

When the light-emitting substance is an organic compound, the application of voltage to the light-emitting element makes electrons injected from an electrode into a layer containing the light-emitting organic compound, holes injected from the other electrode into the layer containing the light-emitting organic compound, and then electric current flows. Then, the recombination of these carriers (electrons and holes) excites the light-emitting organic compound. The light-emitting organic compound emits light in returning to a ground state. Because of such mechanism, such a light-emitting element is referred to as a light-emitting element of a current excitation type.

Excitation states of an organic compound can be classified into two types: a singlet excited state ($S^*$) and a triplet excited state ($T^*$). The statistical generation ratio of the singlet excited state ($S^*$) and the triplet excited state ($T^*$) in a light-emitting element is considered to be $S^*:T^*=1:3$.

A ground state of a light-emitting organic compound is usually a singlet state. Therefore, light emission in returning to a singlet ground state from a singlet excited state ($S^*$) is referred to as fluorescence since it is caused by electronic transition between the same multiplets. On the other hand, light emission in returning to a singlet ground state from a triplet excited state ($T^*$) is referred to as phosphorescence since it is caused by electronic transition between different multiplets. In most of the compounds which emit fluorescence (hereinafter referred to as "fluorescent compounds"), only fluorescence is observed and phosphorescence is not at room temperature. Therefore, the maximum value of the internal quantum efficiency (the ratio of photons to be generated with respect to injected carriers) of a light-emitting element containing a fluorescent compound is said to be theoretically 25%, on grounds that $S^*:T^*=1:3$.

On the other hand, by using a compound which emits phosphorescence (hereinafter referred to as a "phosphorescent compound"), an internal quantum efficiency of 75 to 100% is possible in theory. In other words, it is possible to achieve light emission efficiency which is three to four times that of a fluorescent compound. For such a reason, a light-emitting element using a phosphorescent compound is proposed in order to achieve a highly efficient light-emitting element (for example, refer to Non-Patent Document 1: Tetsuo TSUTSUI et al., "Japanese Journal of Applied Physics" vol. 38, 1999, pp. L1502-L1504)

As a phosphorescent compound, a complex containing iridium (Ir) as a central metal is used in general as in Non-Patent Document 1. However, iridium is a noble metal and exists in crusts in extremely small amounts. Accordingly, there arises a problem of resource depletion of iridium, as light-emitting devices and electronic appliances using light-emitting elements come into wide use. In addition, in order to reduce adverse impact on the environment, methods for reusing iridium are needed.

DISCLOSURE OF INVENTION

The present invention has been devised in view of the above problems. An object of the present invention is to provide a method for collecting a scarce metal such as iridium from a light-emitting element no longer needed.

An aspect of the present invention is a method for collecting metal from an organic metal compound, including a step of ashing an EL layer of a light-emitting element containing an organic metal compound which can emit visible light in returning to a singlet ground state from a triplet excited state at room temperature through heat treatment. In this specification, the EL layer denotes a layer provided between a pair of electrodes in a light-emitting element.

Another aspect of the present invention is a method for collecting a metal from an organic metal compound, including a step of performing a heat treatment at a temperature of 800° C. or higher on an EL layer of a light-emitting element containing an organic metal compound which can emit visible light in returning to a singlet ground state from a triplet excited state at room temperature.

Another aspect of the present invention is a method for collecting a metal from an organic metal compound, including a step of performing a heat treatment at a temperature of 800° C. or higher under atmospheric air or an oxygen atmosphere on an EL layer of a light-emitting element containing an organic metal compound which can emit visible light in returning to a singlet ground state from a triplet excited state at room temperature, and collecting a metal oxide which remains after the heat treatment.

Another aspect of the present invention is a method for collecting a metal from an organic metal compound, including a step of performing a heat treatment on an EL layer of a light-emitting element containing an organic metal compound at a temperature of 800° C. or higher under a reducing atmosphere or with a reducing agent, and collecting a metal oxide which remains after the heat treatment.

In the above structure, the remaining metal or the remaining metal oxide may be treated with acid water after the heat treatment, and a solution in which a metal compound containing the metal which constitutes the organic metal compound is dissolved may be obtained. As the acid water, water containing any of the following can be used: hydrogen chloride, hydrogen bromide, hydrogen fluoride, hydrogen iodide, sulfuric acid, nitric acid, nitrous acid, and acetic acid.

In the above structure, a step of oxidizing the solution in which the metal compound is dissolved may be included.

In the above structure, a step of electrolyzing the solution in which the metal compound is dissolved may be included.

In the above structure, a step of reacting the metal contained in the solution in which the metal compound is dissolved and an organic ligand to form a metal complex may be included.

In the above structure, a step of reacting the metal contained in the solution in which the metal compound is dissolved and an organic ligand to form a metal complex, and a step of extracting the metal complex with a solvent which dissolves the metal complex may be included. In this case, it is preferable that the solvent be not uniformly mixed with water.

Another aspect of the present invention is a method for collecting a metal from an organic metal compound, including a first step of exposing an EL layer by detaching one in a pair of electrodes included in a light-emitting element from the light-emitting element in which the EL layer containing an organic metal compound which can emit visible light in returning to a singlet ground state from a triplet excited state at room temperature is formed between the pair of electrodes, and a second step of irradiating a solution in which the EL layer is dissolved in a solvent with microwaves.

Another aspect of the present invention is a method for collecting a metal from an organic metal compound, including a first step of exposing an EL layer by detaching one in a pair of electrodes included in a light-emitting element from the light-emitting element in which the EL layer containing an organic metal compound which can emit visible light in returning to a singlet ground state from a triplet excited state at room temperature is formed between the pair of electrodes, and a second step of adding an organic compound to a solution in which the EL layer is dissolved in a solvent and performing microwave irradiation.

In the above structure, a third step may be included in which a solution in which the metal compound containing the metal which constitutes the organic metal compound is dissolved or a suspension in which the metal compound is suspended is formed by treating the solution irradiated with the microwaves with a solvent containing acid water.

Another aspect of the present invention is a method for collecting a metal from an organic metal compound, including a first step of exposing an EL layer by detaching one in a pair of electrodes included in a light-emitting element from the light-emitting element in which the EL layer containing an organic metal compound which can emit visible light in returning to a singlet ground state from a triplet excited state at room temperature is formed between the pair of electrodes, and a second step of forming a solution in which the metal compound containing the metal which constitutes the organic metal compound is dissolved or a suspension in which the metal compound is suspended, by treating the EL layer of the light-emitting element with a solvent containing acid water.

In the above structure, as the acid water, water containing any of the following can be used: hydrogen chloride, hydrogen bromide, hydrogen fluoride, hydrogen iodide, sulfuric acid, nitric acid, nitrous acid, and acetic acid.

In the above method, a step of oxidizing the solution in which the metal compound is dissolved or the suspension in which the metal complex is suspended may be included.

In the above structure, a step of electrolyzing the solution in which the metal compound is dissolved may be included.

In the above structure, a step of forming a metal complex by reacting the metal contained in the solution in which the metal compound is dissolved or the suspension in which the metal complex is suspended and an organic ligand may be included.

In the above structure, a step of forming a metal complex by reacting the metal contained in the solution in which the metal compound is dissolved or the suspension in which the metal complex is suspended and an organic ligand, and a step of extracting the metal complex using a solvent which dissolves the metal complex may be included.

In the above structure, the organic ligand is supported by a high molecular compound, and the metal complex may be formed by mixing the organic ligand supported by the high molecular compound and the solution or a mixture containing the metal compound.

In the above structure, it is preferable that the organic ligand be any of the following: an amine derivative, an ethylenediamine derivative, a triethylenediamine derivative, an ethylenediaminethiocarboaldehyde derivative, a phenol derivative, a polyphenol derivative, a thiol derivative, a cyclic thiol derivative, an ether derivative, a cyclic ether derivative, a uracil derivative, an amide derivative, ammonium salt, a pyridine derivative, an amino sulfide derivative, an aniline derivative, a phosphoric acid derivative, phosphonium salt, a phosphine oxide derivative, a thiourea derivative, a benzothiazole derivative, or a thiocarbonyl derivative.

In the above structure, it is preferable that the metal belong to any of the groups 7 to 11 in the periodic table. Further, it is preferable that the metal be Ir, Pt, Ru, or Re. Furthermore, it is preferable that the metal be a rare earth metal.

According to the present invention, resources of metals such as iridium (Ir) and platinum (Pt), which are scarce metals, can be utilized efficiently.

BEST MODE FOR CARRYING OUT THE INVENTION

Figure 1:
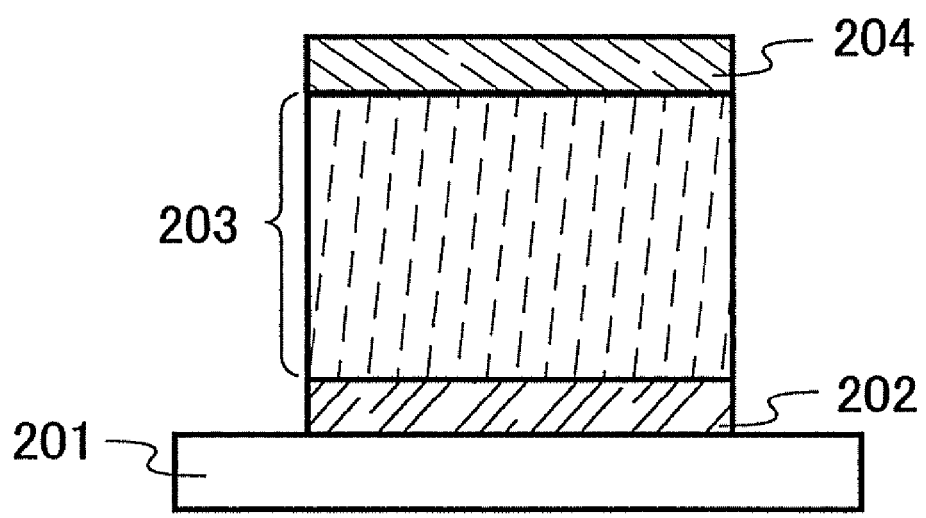
FIG. 1 is a diagram illustrating a light-emitting element.

Embodiment modes of the present invention are described in detail hereinafter with reference to the diagram. Note that the present invention is not limited to the following description and it is easily understood by those skilled in the art that the modes and details disclosed herein can be modified in various ways without departing from the spirit and the scope of the present invention. Therefore, the present invention should not be interpreted as being limited to the description of the embodiment modes to be given below.

Embodiment Mode 1

This embodiment mode describes a method for collecting a metal atom from a light-emitting element containing an organic metal compound which can emit visible light in returning to a singlet ground state from a triplet excited state at room temperature.

FIG. 1 shows a structure of a general light-emitting element. The light-emitting element shown in FIG. 1 is formed over a substrate 201 and includes a first electrode 202, an EL layer 203, and a second electrode 204. The EL layer 203 is sandwiched between the first electrode 202 and the second electrode 204, and contains an organic metal compound which can emit visible light in returning to a singlet ground state from a triplet excited state at room temperature. To be more specific, the EL layer 203 contains a metal belonging to any of the groups 7 to 11 in the periodic table or a rare earth metal. It is preferable in particular that the metal be Ir, Pt, Ru, or Re, which is used often in light-emitting elements. These metals are noble metals. Since noble metals exist in extremely small amounts and are expensive, collecting them from light-emitting elements can significantly contribute to reduction in cost. In particular, Ir, Pt, Ru, and Re are commonly used as organic metal compounds which can emit visible light in returning to a singlet ground state from a triplet excited state at room temperature, and can be utilized efficiently by collecting them from light-emitting elements.

For example, compounds represented by structural formulae shown below are given as organic metal compounds which can emit visible light and are contained in EL layers. Note that the present invention is not limited to these.

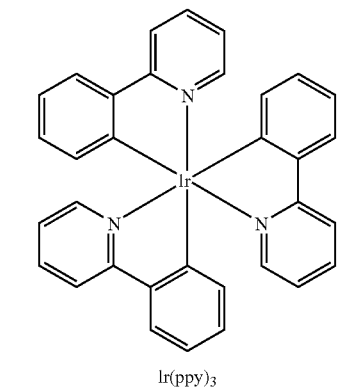

Ir(ppy)$_3$

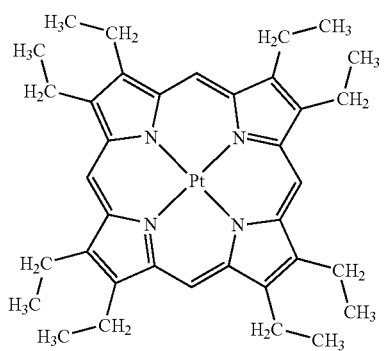

PtOEP

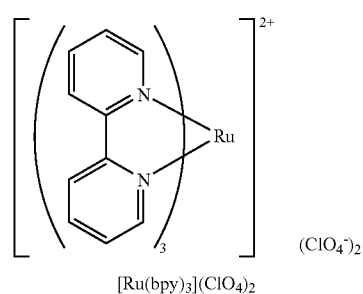

[Ru(bpy)$_3$](ClO$_4$)$_2$

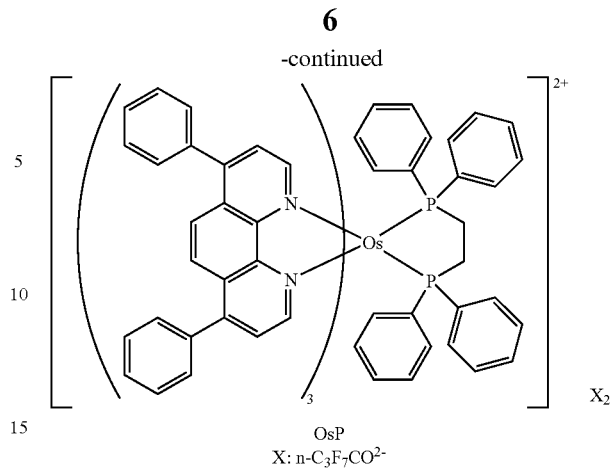

OsP
X: n-C$_3$F$_7$CO$^{2-}$

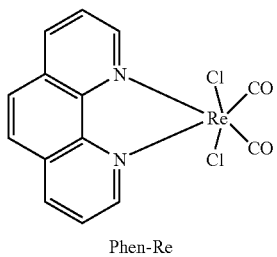

Phen-Re

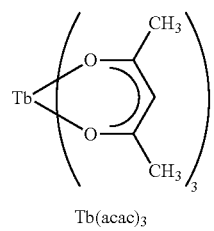

Tb(acac)$_3$

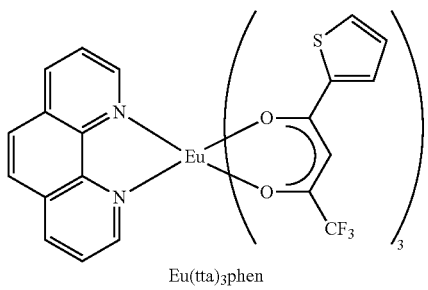

Eu(tta)$_3$phen

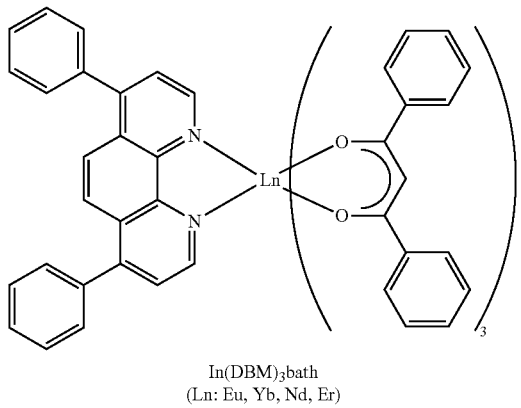

In(DBM)$_3$bath
(Ln: Eu, Yb, Nd, Er)

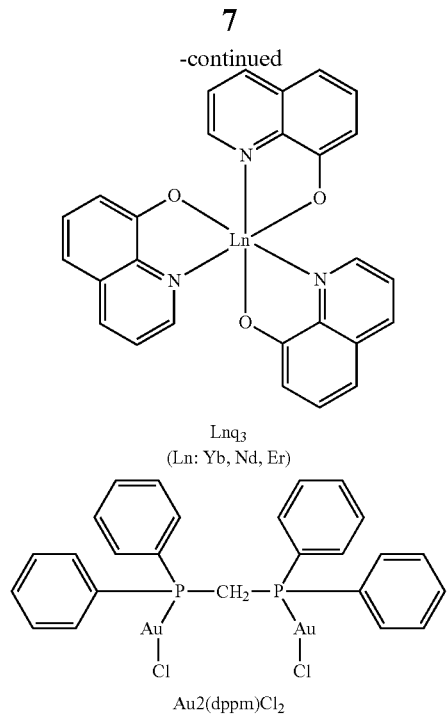

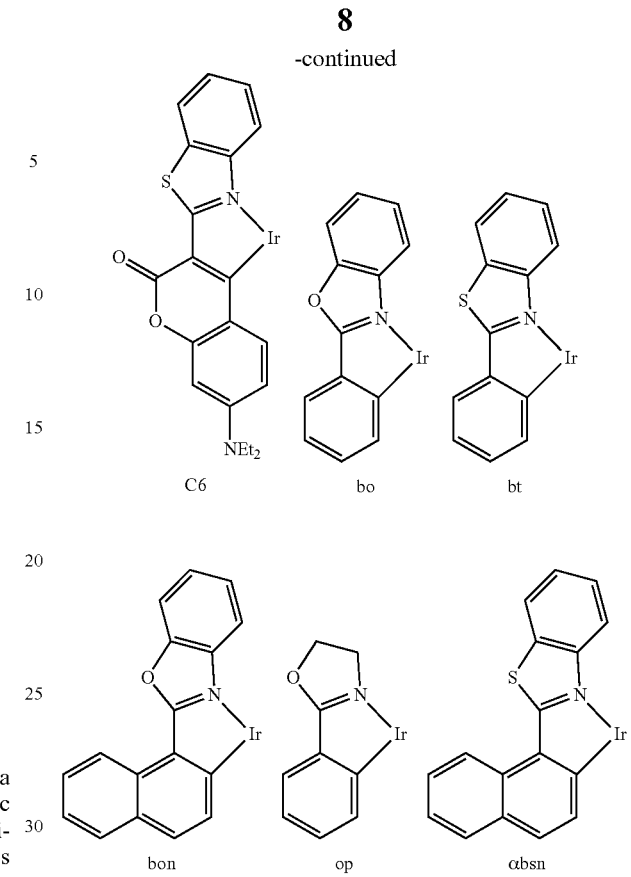

The organic metal compounds shown above include a metal belonging to any of the groups 7 to 11 in the periodic table or a rare earth metal. Resources can be utilized efficiently by collecting the metal belonging to any of the groups 7 to 11 in the periodic table or the rare earth metal from light-emitting elements containing these organic metal compounds.

In addition to the above organic metal compounds, in particular, organic metal compounds containing Ir as a central metal are commonly used in light-emitting elements. For example, organic metal compounds having the following partial structures are given as examples.

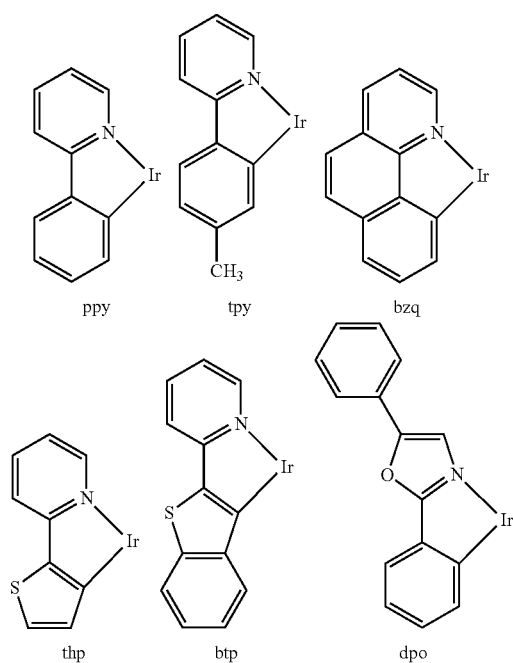

In addition, organic metal compounds having the above partial structures and the following ligand are also commonly used.

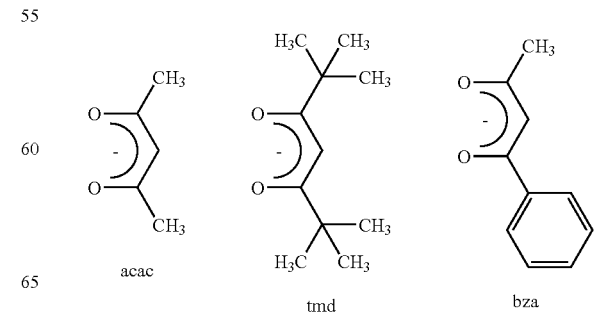

-continued

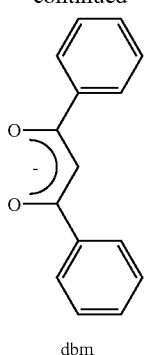

dbm

As organic metal compounds having the above partial structures, for example, compounds represented by the following structural formulae are given.

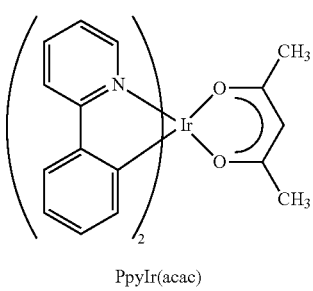

PpyIr(acac)

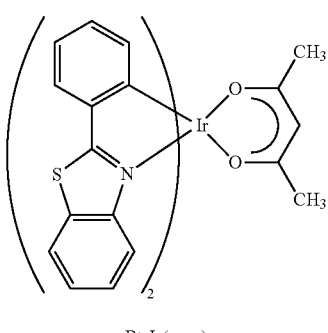

Bt₂Ir(acac)

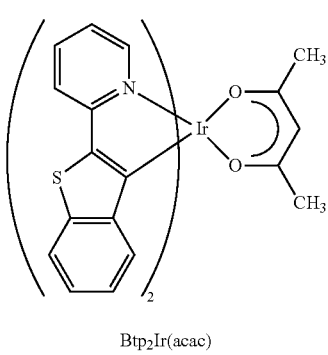

Btp₂Ir(acac)

In addition, compounds represented by the following formulae are commonly used in light-emitting elements.

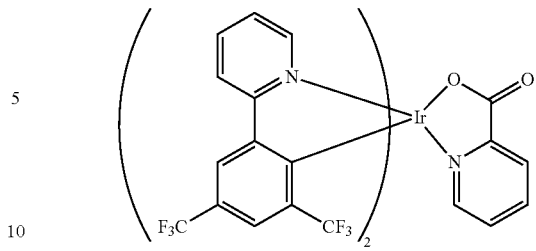

(CF₃ppy)₂Ir(pic)

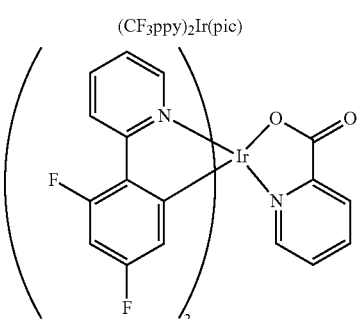

FIrpic

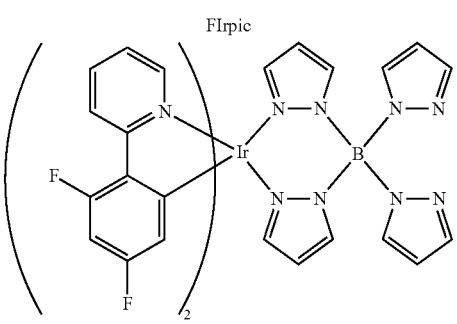

FIr6

The first electrode 202 and the second electrode 204 contain various metals, alloys, conductive compounds, and mixtures thereof, and the like. For example, a transparent conductive film made of indium tin oxide (ITO), indium tin oxide containing silicon or silicon oxide, indium zinc oxide (IZO), or the like can be used for an electrode through which light is extracted. Further, various conductive materials such as gold (Au), platinum (Pt), nickel (Ni), tungsten (W), chromium (Cr), molybdenum (Mo), iron (Fe), cobalt (Co), copper (Cu), palladium (Pd), or aluminum (Al) can be used. Furthermore, an element belonging to the group 1 or 2 in the periodic table, i.e. an alkali metal such as lithium (Li) and cesium (Cs), an alkaline earth metal such as magnesium (Mg), calcium (Ca), and strontium (Sr); an alloy containing these elements (MgAg, AlLi, or the like); a rare earth metal such as europium (Eu), and ytterbium (Yb); alloys containing these elements; or the like can be used.

A material which emits visible light in returning to a singlet ground state from a triplet excited state at room temperature is extracted from a light-emitting element having such a structure described above. First, the first electrode 202 or the second electrode 204 is detached from the light-emitting element. It is acceptable as long as at least one in the pair of electrodes is detached, but it is easier to detach an electrode that is formed after forming the EL layer. It is relatively easy to detach the electrode since an electrode made of an inorganic compound generally has low adhesion to an organic compound. The electrode can be detached by, for example, putting adhesive tape on the electrode and peeling off the tape afterwards. In particular, the electrode which is formed on a region smaller than the EL layer, can easily be detached.

In addition to adhesive tape, it is also possible to detach the electrode by applying a light curing resin, a heat curing resin, or the like and peeling it afterwards. A versatile resin such as an epoxy resin, a polyimide resin, or a phenol resin can be used as the resin.

Furthermore, the electrode may be removed by acid treatment or alkaline treatment when the electrode contains a material which is reactive with acid or alkali, such as aluminum (Al).

Thereafter, the EL layer is extracted. Various methods can be used to take out the EL layer. For example, an organic compound contained in the EL layer may be extracted in a state of solution after being dissolved in a solvent. A solvent of aromatic hydrocarbon such as toluene, xylene, and tetralin; aromatic hydrocarbon containing halogen, such as dichlorobenzene and chlorobenzene; aliphatic halogenated hydrocarbon series such as dichloromethane and chloroform; or the like are given as examples of the solvent which can dissolve the organic compound contained in the EL layer. Further, a solvent of ether series such as tetrahydrofuran and diethyl ether may also be used. Here, the EL layer need not completely be dissolved in the solvent and may be extracted, dissolved partially in a state of a mixture.

Next, a metal atom which constitutes an organic metal compound which can emit visible light in returning to a singlet ground state from a triplet excited state at room temperature is collected from the solution or the mixture containing various compounds which constitute the EL layer.

A first method is as follows: the solution or the mixture containing various compounds which constitute the EL layer is subjected to heat treatment and ashed. The heat treatment may be carried out under any of the following: atmospheric air, an oxygen atmosphere, or a reducing atmosphere. Further, the heat treatment may be carried out with a reducing agent. When the heat treatment is carried out under atmospheric air or an oxygen atmosphere, a metal oxide can be obtained. When the heat treatment is carried out under a reducing atmosphere, e.g. a $H_2$ gas atmosphere, a metal can be obtained. Furthermore, when the heat treatment is carried out with a reducing agent such as palladium carbon (PdC) or aluminum (Al), a metal can be obtained. When a variety of metals are contained in the EL layer, it is preferable that the heat treatment be carried out under a reducing atmosphere since metals can be separated with more ease compared with metal oxides by utilizing the difference in melting points. In addition, it is preferable that the heat treatment be carried out at a temperature of 800° C. or higher, more preferably 1000° C. or higher, in order to prevent an organic matter from remaining.

Next, the metal or the metal oxide obtained by the above method is separated. The metal or the metal oxide can be separated by utilizing the difference in melting points of the metals, for example. By utilizing the difference in melting points, the targeted metal atom can be collected: i.e., the metal atom can be collected from the organic metal compound which can emit visible light in returning to a singlet ground state from a triplet excited state at room temperature.

In addition to utilizing the difference in melting points, the targeted metal atom can also be collected by using the following method.

First, the metal or the metal oxide obtained by the above method is treated with acid water: that is to say, it is mixed with acid water and stirred. In concrete terms, the metal or the metal oxide obtained by the above heat treatment is reacted with water containing hydrogen chloride, hydrogen bromide, hydrogen fluoride, acetic acid, nitric acid, nitrous acid, sulfuric acid, hydrogen iodide, or the like. Heat treatment or oxidation treatment may be carried out if necessary. Oxidation treatment may be carried out with oxygen by introducing air, for example. Further, oxidation treatment may be carried out by mixing the metal or the metal oxide with hydrogen peroxide, whereby the metal or the metal oxide is oxidized. Furthermore, oxidation treatment may be carried out with halogen such as iodine, chlorine, or bromine.

Thus, a metal compound of a transition metal belonging to any of the groups 7 to 11 or that of a rare earth metal can be obtained. To be specific, a solution of chloride, bromide, fluoride, iodide, sulfate, sulfide, nitrate, nitrite, acetate, or oxide can be obtained. Chloride, bromide, fluoride, iodide, sulfate, sulfide, nitrate, nitrite, and acetate are preferable since the solubility thereof is high.

The solution which is obtained in this manner and in which the metal compound is dissolved may be subjected to alkali treatment. Through the alkali treatment, a hydroxide, ammonium salt, phosphonium salt, and sulfonium salt of the metal can be produced, and a solution thereof can be obtained. Ammonium salt, phosphonium salt, and sulfonium salt are preferable since the solubility thereof is high.

After forming the solution of the metal compound which contains a transition metal belonging to any of the groups 7 to 11 or a rare earth metal as a central metal, the metal compound is separated from the solution. In concrete terms, there are a method in which electrolysis is carried out and a method in which the solution is treated with a solution containing an organic ligand.

In the electrolysis method, the transition metal belonging to any of the groups 7 to 11 or the rare earth metal is deposited on or near an electrode by connecting the solution of the metal compound containing the transition metal belonging to any of the groups 7 to 11 or the rare earth metal as a central metal to a DC power source. Even if another kind of metal is contained in the solution, it is possible to separate only the targeted metal with ease by carrying out the electrolysis since each metal has a different ionization tendency. For the electrolysis, various solvents can be used, e.g. water, acetonitrile, or molten salt.

As a method in which the solution containing the metal compound which contains the transition metal belonging to any of the groups 7 to 11 or the rare earth metal as a central metal is treated with the solution containing an organic ligand, a method can be given in which the solution containing the organic ligand is added to the solution containing the metal compound, whereby the metal compound and the organic ligand are reacted with each other to form a metal complex, and then the metal complex is extracted using a solvent which dissolves the metal complex. In this method, it is preferable that the solvent which dissolves the metal complex be not uniformly mixed with water.

The organic ligand mentioned here is a molecule which can form a plurality of coordinate bonds with the metal, and is also referred to as a chelate ligand. To be specific, the following substances can be given as examples: an amine derivative, an ethylenediamine derivative, a triethylenediamine derivative, an ethylenediaminethiocarboaldehyde derivative, a phenol derivative, a polyphenol derivative, a thiol derivative, a cyclic thiol derivative, an ether derivative, a cyclic ether derivative, a uracil derivative, an amide derivative, ammonium salt, a pyridine derivative, an amino sulfide derivative, an aniline derivative, a phosphoric acid derivative, phosphonium salt, a phosphine oxide derivative, a thiourea derivative, a benzothiazole derivative, a thiocarbonyl derivative, and the like. These compounds may be supported by polymer compounds. In such a case, as the polymer compounds, those which contain polystyrene, polyacrylic acid ester, polymethacrylic acid ester, polyvinyl ether, polyvinyl ester, or the like as a principal chain can be used. Alternatively, the organic ligand described above may be incorporated into a side chain of a cross-linked material of these polymer compounds.

For example, a compound represented by General Formula (1), a compound represented by General Formula (2), and a compound represented by General Formula (3) are given as an amine derivative, an ethylenediamine derivative, and a triethylenediamine derivative, respectively.

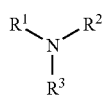
(1)

In General Formula (1), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

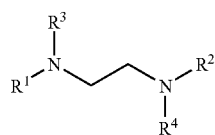
(2)

In General Formula (2), $R^1$ to $R^4$ each independently represent hydrogen, an alkyl group, or an aryl group. In concrete terms, a methyl group, a butyl group, a hexyl group, a decyl group, a phenyl group, a naphthyl group, and the like are given as examples.

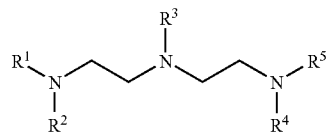
(3)

In General Formula (3), $R^1$ to $R^5$ each independently represent hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (4) is given as an ethylenediaminethiocarboaldehyde derivative.

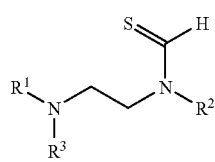
(4)

In General Formula (4), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (5), a compound represented by General Formula (6), and a compound represented by General Formula (7) are given as a phenol derivative and a polyphenol derivative.

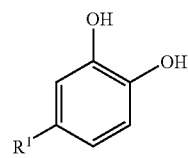
(5)

In General Formula (5), $R^1$ represents hydrogen, an alkyl group, or an aryl group. In concrete terms, a methyl group, a butyl group, a hexyl group, a decyl group, a phenyl group, a naphthyl group, and the like are given as examples.

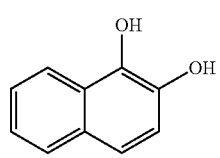
(6)

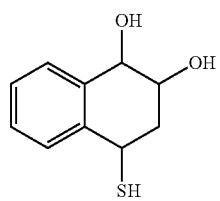
(7)

For example, a compound represented by General Formula (8) and a compound represented by General Formula (9) are given as a thiol derivative and a cyclic thiol derivative.

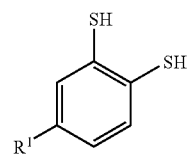
(8)

In General Formula (8), $R^1$ represents hydrogen, an alkyl group, or an aryl group. In concrete terms, a methyl group, a butyl group, a hexyl group, a decyl group, a phenyl group, a naphthyl group, and the like are given examples.

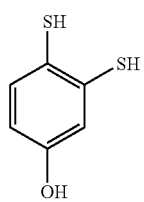
(9)

For example, a compound represented by General Formula (10), a compound represented by General Formula (11), and a compound represented by General Formula (12) are given as an ether derivative and a cyclic ether derivative.

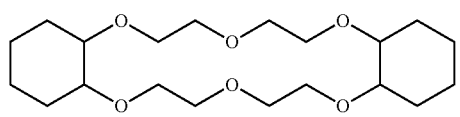

(10)

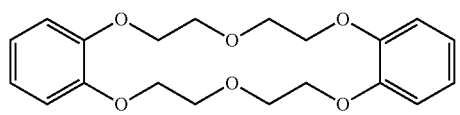

(11)

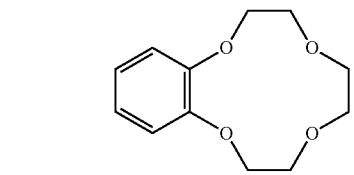

(12)

For example, a compound represented by General Formula (13) and a compound represented by General Formula (14) are given as a uracil derivative.

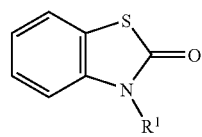

(13)

In General Formula (13), $R^1$ represents hydrogen, an alkyl group, or an aryl group. In concrete terms, a methyl group, a butyl group, a hexyl group, a decyl group, a phenyl group, a naphthyl group, and the like are given as examples.

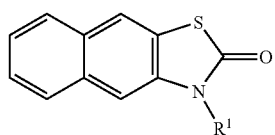

(14)

In General Formula (14), $R^1$ represents hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (15), a compound represented by General Formula (16), and a compound represented by General Formula (17) are given as an amide derivative.

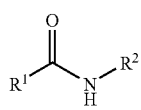

(15)

In General Formula (15), $R^1$ and $R^2$ each independently represent hydrogen, an alkyl group, or an aryl group. In concrete terms, a methyl group, a butyl group, a hexyl group, a decyl group, a phenyl group, a naphthyl group, and the like are given as examples.

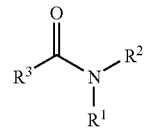

(16)

In General Formula (16), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

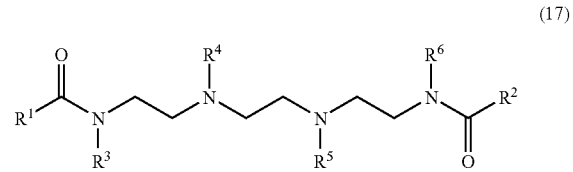

(17)

In General Formula (17), $R^1$ to $R^6$ each independently represent hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (18) is given as ammonium salt.

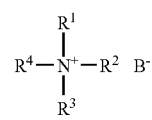

(18)

B = Cl, SO$_4$, ClO$_4$, CH$_3$CO$_2$, Br, I, CO$_3$, HCO$_3$, HSO$_4$

In General Formula (18), $R^1$ to $R^4$ each independently represent hydrogen, an alkyl group, or an aryl group. In concrete terms, a methyl group, a butyl group, a hexyl group, a decyl group, a phenyl group, a naphthyl group, and the like are given as examples. Further, B$^-$ represents any of the following: a chloride ion, a sulfate ion, a perchlorate ion, an acetate ion, a bromide ion, an iodide ion, a carbonate ion, a hydrogen carbonate ion, and a sulfite ion.

For example, a compound represented by General Formula (19) and a compound represented by Formula (20) are given as a pyridine derivative.

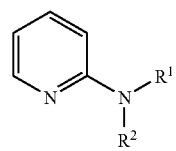

(19)

In General Formula (19), $R^1$ and $R^2$ each independently represent hydrogen, an alkyl group, or an aryl group. In concrete terms, a methyl group, a butyl group, a hexyl group, a decyl group, a phenyl group, a naphthyl group, and the like are given as examples.

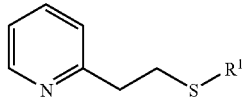
(20)

In General Formula (20), $R^1$ represents hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (21) is given as an amino sulfide derivative.

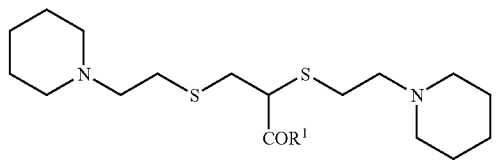
(21)

In General Formula (21), $R^1$ represents hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (22) is given as an aniline derivative.

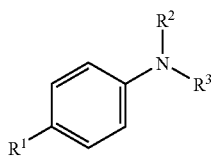
(22)

In General Formula (22), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (23), a compound represented by General Formula (24), and a compound represented by General Formula (25) are given as a phosphoric acid derivative, phosphonium salt, and a phosphine oxide derivative.

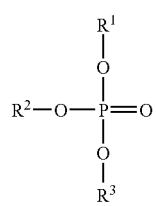
(23)

In General Formula (23), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

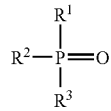
(24)

In General Formula (24), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

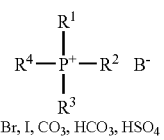
(25)

B = Cl, SO$_4$, ClO$_4$, CH$_3$CO$_2$, Br, I, CO$_3$, HCO$_3$, HSO$_4$

In General Formula (25), $R^1$ to $R^4$ each independently represent hydrogen, an alkyl group, or an aryl group. In concrete terms, a methyl group, a butyl group, a hexyl group, a decyl group, a phenyl group, a naphthyl group, and the like are given as examples. Further, B$^-$ represents any of the following: a chloride ion, a sulfate ion, a perchlorate ion, an acetate ion, a bromide ion, an iodide ion, a carbonate ion, a hydrogen carbonate ion, and a sulfite ion.

For example, a compound represented by General Formula (26) is given as a thiourea derivative.

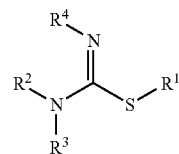
(26)

In General Formula (26), $R^1$ to $R^4$ each independently represent hydrogen, an alkyl group, or an aryl group. In concrete terms, a methyl group, a butyl group, a hexyl group, a decyl group, a phenyl group, a naphthyl group, and the like are given as examples.

For example, a compound represented by General Formula (27) is given as a benzothiazole derivative.

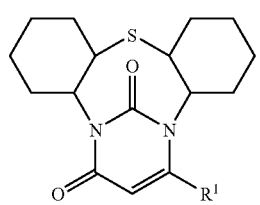
(27)

In General Formula (27), $R^1$ represents hydrogen, an aryl group, or an alkoxy group.

For example, a compound represented by General Formula (28), a compound represented by General Formula (29), a compound represented by General Formula (30), and a compound represented by General Formula (31) are given as a thiocarbonyl derivative.

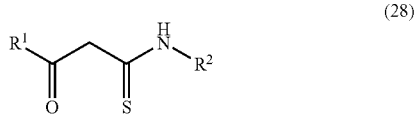

In General Formula (28), $R^1$ and $R^2$ each independently represent hydrogen, an alkyl group, or an aryl group. In concrete terms, a methyl group, a butyl group, a hexyl group, a decyl group, a phenyl group, a naphthyl group, and the like are given as examples.

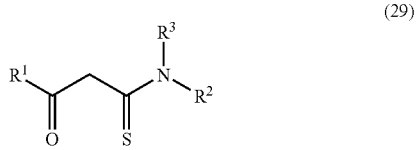

In General Formula (29), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

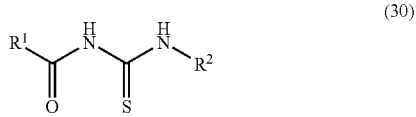

In General Formula (30), $R^1$ and $R^2$ each independently represent hydrogen, an alkyl group, or an aryl group. In concrete terms, a methyl group, a butyl group, a hexyl group, a decyl group, a phenyl group, a naphthyl group, and the like are given as examples.

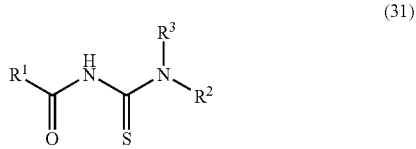

In General Formula (31), $R^1$ to $R^3$ each independently represent hydrogen, an alkyl group, or an aryl group. In concrete terms, a methyl group, a butyl group, a hexyl group, a decyl group, a phenyl group, a naphthyl group, and the like are given as examples.

The method described above makes it possible to separate a central metal which constitutes a material that emits visible light in returning to a singlet ground state from a triplet excited state at room temperature and is contained in a light-emitting element, i.e. a metal belonging to any of the groups 7 to 11 or a rare earth metal. According to the method described in this embodiment mode, resources of the metal belonging to any of the groups 7 to 11 or the rare earth metal such as iridium (Ir) and platinum (Pt), which are scarce metals, can be utilized efficiently.

Similarly, a central metal which constitutes a material that emits visible light in returning to a singlet ground state from a triplet excited state at room temperature can be collected also from a light-emitting element in which a plurality of EL layers are stacked with a charge-generating layer interposed therebetween/thereamong.

This embodiment mode can appropriately be combined with other embodiment modes.

Embodiment Mode 2

This embodiment mode explains a method for collecting a metal atom, which is different from the method described in Embodiment Mode 1.

In a similar manner with Embodiment Mode 1, an EL layer is extracted and then a solution or a mixture containing various compounds which constitute the EL layer is formed.

Next, the solution in which the EL layer is dissolved in a solvent, or a mixture in which the EL layer is partially dissolved in a solvent is irradiated with microwaves. The microwaves may be adjusted so that the organic metal compound which is contained in the EL layer and can emit visible light in returning to a singlet ground state to a triplet excited state at room temperature can decompose. Further, the solution or the mixture can also be irradiated with light in microwave irradiation. The light irradiation makes the organic metal compound in an excited state and can promote further decomposition. Furthermore, an organic compound may be added in microwave irradiation. Acetylacetone, picolinic acid, pyridine, and the like are given as the organic compound. Adding the organic compound can promote the decomposition of the organic metal compound which can emit visible light in returning to a singlet ground state from a triplet excited state at room temperature. It is preferable that a solvent used in microwave irradiation have high polarity. Using the high-polar solvent enables the efficient decomposition of the organic metal compound which can emit visible light in returning to a singlet ground state from a triplet excited state at room temperature since the value of generated heat increases in microwave irradiation. Glycerol, 2-ethoxyethanol, ethylene glycol, dichloromethane, or the like can be given as the high-polar solvent. Further, ionic liquid of 1-butyl-3-methylimidazoliumhexafluorophosphate, 1-butyl-3-methylimidazoliumtetrafluoroborate, or the like may be used. Furthermore, water may be added to these solvents as well.

After the microwave irradiation, an operation of separating the targeted metal from the solution or the mixture containing the decomposed matter is carried out, if necessary. As a method for separating the targeted metal, the following methods are given: after treating the solution or the mixture with acid water, electrolysis is carried out; after treating the solution or the mixture with acid, an organic ligand is added and a metal complex is extracted; or an organic ligand is added to the solution or the mixture containing the decomposed matter and a metal complex is extracted directly.

The solution or the mixture containing the decomposed matter which is obtained as described above is treated with acid water. That is to say, the solution or the mixture is mixed with acid water and stirred. In concrete terms, the solution or the mixture containing the decomposed matter is reacted with water containing hydrogen chloride, hydrogen bromide, hydrogen fluoride, acetic acid, nitric acid, nitrous acid, sulfuric acid, hydrogen iodide, or the like. Heat treatment or oxidation treatment may be carried out if necessary. Oxidation treatment may be carried out with oxygen by introducing air, for example. Further, oxidation treatment may be carried out by mixing the solution or the mixture with hydrogen peroxide, whereby the solution or the mixture is oxidized. Furthermore, oxidation treatment may be carried out with halogen such as iodine, chlorine, and bromine.

Accordingly, a metal compound which contains a transition metal belonging to any of the groups 7 to 11 or that of a rare earth metal as a central metal can be obtained. To be specific, chloride, bromide, fluoride, iodide, sulfate, sulfide, nitrate, nitrite, acetate, or oxide can be obtained.

The solution which is obtained in this manner and in which the metal compound is dissolved or a suspension which is obtained in this manner and in which the metal compound is suspended may be treated with alkali. Through the alkali treatment, a hydroxide, ammonium salt, phosphonium salt, and sulfonium salt of the metal can be produced, and a solution thereof or a suspension thereof can be obtained.

After forming the solution or the suspension containing the metal compound which contains a transition metal belonging to any of the groups 7 to 11 or a rare earth metal as a central metal, the metal compound is separated from the solution or the suspension. In concrete terms, there are a method in which electrolysis is carried out and a method in which the solution or the suspension is treated with a solution containing an organic ligand. Electrolysis can preferably be employed for the solution. Treatment with a solution containing an organic ligand can be preferably employed both for the solution and the suspension.

In the electrolysis method, the transition metal belonging to any of the groups 7 to 11 or the rare earth metal is deposited on or near an electrode by connecting the solution of the metal compound containing the transition metal belonging to any of the groups 7 to 11 or the rare earth metal as a central metal to a DC power source. Even if another kind of metal is contained in the solution, it is possible to separate only the targeted metal with ease by carrying out the electrolysis since each metal has a different ionization tendency. For the electrolysis, various solvents can be used, e.g. water, acetonitrile, and molten salt.

As a method in which the solution or the suspension containing the metal compound which contains the transition metal belonging to any of the groups 7 to 11 or the rare earth metal as a central metal is treated with the solution containing the organic ligand, a method can be given in which the solution containing the organic ligand is added to the solution or the suspension containing the metal compound, whereby the metal compound and the organic ligand are reacted with each other to form a metal complex, and then the metal complex is extracted with a solvent which dissolves the metal complex. In this method, it is preferable that the solvent which dissolves the metal complex be not uniformly mixed with water. As the organic ligand, the organic ligand described in Embodiment Mode 1 can be used.

Further, by adding an organic ligand to the solution or the mixture containing the decomposed matter to extract a metal complex directly, the targeted metal can be separated. Also in the case of direct extraction, by adding a solution containing an organic ligand to the solution or the mixture containing the decomposed matter, the metal contained in the decomposed matter and the organic ligand are reacted with each other to form a metal complex, so that the metal complex can be extracted with a solvent which dissolves the metal complex. In this case, as the organic ligand, the organic ligand described in Embodiment Mode 1 can be used.

The method described above makes it possible to separate a central metal which constitutes a material that emits visible light in returning to a singlet ground state from a triplet excited state at room temperature and is contained in a light-emitting element, i.e. a metal belonging to any of the groups 7 to 11 or a rare earth metal.

According to the method described in this embodiment mode, resources of the metal belonging to any of the groups 7 to 11 or the rare earth metal such as iridium (Ir) and platinum (Pt), which are scarce metals, can be utilized efficiently.

This embodiment mode can appropriately be combined with other embodiment modes.

Embodiment Mode 3

This embodiment mode explains a method for collecting a metal atom, which is different from the methods described in Embodiment Mode 1 and Embodiment Mode 2.

In a similar manner with Embodiment Mode 1, an EL layer is extracted and then a solution or a mixture containing various compounds which constitute the EL layer is formed.

Next, the solution in which the EL layer is dissolved in a solvent, or the mixture in which the EL layer is partially dissolved in a solvent is treated with acid water. That is to say, the solution or the mixture is mixed with acid water and stirred. In concrete terms, the organic compounds which constitute the EL layer is reacted with water containing hydrogen chloride, hydrogen bromide, hydrogen fluoride, acetic acid, nitric acid, nitrous acid, sulfuric acid, hydrogen iodide, or the like. Heat treatment or oxidation treatment may be carried out if necessary. Oxidation treatment may be carried out with oxygen by introducing air, for example. Further, oxidation treatment may be carried out by mixing the solution or the metal mixture with hydrogen peroxide, whereby the solution or the mixture is oxidized. Furthermore, oxidation treatment may be carried out with halogen such as iodine, chlorine, and bromine. Still furthermore, microwave irradiation may be carried out as the heat treatment.

Accordingly, a metal compound of a transition metal belonging to any of the groups 7 to 11 or that of a rare earth metal can be obtained. To be specific, chloride, bromide, fluoride, iodide, sulfate, sulfide, nitrate, nitrite, acetate, or oxide can be obtained.

The solution which is obtained in this manner and in which the metal compound is dissolved or a suspension which is obtained in this manner and in which the metal compound is suspended may be treated with alkali. Through the alkali treatment, a hydroxide, ammonium salt, phosphonium salt, and sulfonium salt of the metal can be produced, and a solution thereof or a suspension thereof can be obtained.

After forming the solution or a suspension containing the metal compound which contains a transition metal belonging to any of the groups 7 to 11 or a rare earth metal as a central metal, an operation of separating the metal compound from the solution or the suspension is carried out, if necessary. In concrete terms, there are a method in which electrolysis is carried out and a method in which the solution or the suspension is treated with a solution containing an organic ligand. Electrolysis can preferably be employed for the solution. Treatment with a solution containing an organic ligand can be preferably employed both for the solution and the suspension.

In the electrolysis method, as explained in Embodiment Mode 1 and Embodiment Mode 2, the transition metal belonging to any of the groups 7 to 11 or the rare earth metal is deposited on or near an electrode by connecting the solution of the metal compound containing the transition metal belonging to any of the groups 7 to 11 or the rare earth metal as a central metal to a DC power source. Even if another kind of metal is contained in the solution, it is possible to separate only the targeted metal with ease by carrying out the electrolysis since each metal has a different ionization tendency. For the electrolysis, various solutions can be used, e.g. water, acetonitrile, and molten salt.

Further, by adding the solution containing the organic ligand to the solution or the suspension containing the metal compound which contains the transition metal belonging to any of the groups 7 to 11 or the rare earth metal as a central metal, the metal compound and the organic ligand are reacted with each other to form metal complex, and then the metal complex can be extracted with a solvent which dissolves the metal complex. In this method, it is preferable that the solvent which dissolves the metal complex be not uniformly mixed with water. As the organic ligand, the organic ligand described in Embodiment Mode 1 can be used.

The method described above makes it possible to separate a central metal which constitutes a material that emits visible light in returning to a singlet ground state from a triplet excited state at room temperature and is contained in a light-emitting element, i.e. a metal belonging to any of the groups 7 to 11 or a rare earth metal.

According to the method described in this embodiment mode, resources of the metal belonging to any of the groups 7 to 11 or the rare earth metal such as iridium (Ir) and platinum (Pt), which are scarce metals, can be utilized efficiently.

This embodiment mode can appropriately be combined with other embodiment modes.

Embodiment 1

Hereinafter, an example where a metal is collected from an organic metal compound which can emit visible light in returning to a singlet ground state from a triplet excited state at room temperature according to a method of the present invention is illustrated specifically. In concrete terms, an example where iridium is collected from an organic metal compound containing iridium is illustrated specifically.

An iridium complex is often used for a light-emitting element because it can emit visible light in returning to a singlet ground state from a triplet excited state at room temperature and can accomplish high light emission efficiency. When iridium, which is a noble metal, contained in an iridium complex is collected from a light-emitting element, an electrode of the light-emitting element may be detached using tape or the like, and then an EL layer of the light-emitting element may be dissolved in an organic solvent. However, in the solvent in which the EL layer is dissolved, several kinds of organic compounds can be contained in addition to the iridium complex because materials other than a light-emitting material (e.g. a hole transport material, an electron transport material, a host material for dispersing dopant, and the like) are also usually used for a light-emitting element.

In this embodiment, on the assumption of such a situation, it is demonstrated that a compound containing iridium can be separated from a mixed solution in which three kinds of substances are dissolved: the dissolved substances are an iridium complex, a substance that can be used as a hole transport material or a host material, and a substance that can be used as an electron transport material or a host material <Step 1: Making a Mixed Solution>

20 mg of (acetylacetonato)bis[2,3-bis(4-fluorophenyl)quinoxalinato]iridium(III) (abbreviation: [Ir(Fdpq)$_2$(acac)]), which is an iridium complex, 4,4'-bis[N-(1-naphthyl)-N-phenylamino]biphenyl (abbreviation: NPB), which is a hole transport material, tris(8-quinolinolato)aluminum(III) (abbreviation: Alq$_3$), which is an electron transport material, are each weighed out, and they are dissolved in 3 ml of toluene to make a solution.

<Step 2: Separating and Collecting the Compound Containing Iridium>

Next, 3 ml of 5 M hydrochloric acid solution is added to the mixed solution which is made through the step 1, and the mixed solution to which 3 ml of 5 M hydrochloric acid solution is added is irradiated with microwaves (2.45 GHz, 0 to 250 W, 0 to 250 psi) for 30 minutes to be reacted. After the reaction, black powder is deposited and the reacted solution is separated into a light brown toluene layer and a light yellow hydrochloric acid solution layer. It is observed that 2,3-bis(4-fluorophenyl)quinoxaline, which is a ligand of an iridium complex, and NPB are dissolved in the toluene layer by carrying out thin layer chromatography to the toluene layer, which is an upper layer. Further, the hydrochloric acid solution, which is a lower layer, is light yellow and it is probable that 8-quinolinol, which is a ligand of Alq$_3$, is dissolved therein. Therefore, it is probable that the compound containing iridium is able to be separated by being deposited selectively. The deposited compound containing iridium is filtered, washed with toluene and then with dichloromethane, and is collected. The microwave irradiation is carried out using a microwave synthesis apparatus (Discover: made by CEM Corporation).

The black powder obtained in the step 2 is analyzed by electron probe X-ray microanalysis (EPMA). As a result of the analysis, it is found that elements detected are carbon (C), iridium (Ir), fluorine (F), nitrogen (N), chlorine (Cl), and oxygen (O) (in descending order of detected amounts). From this result, it is confirmed that iridium is able to be collected from the mixed solution containing [Ir(Fdpq)$_2$(acac)], NPB and Alq$_3$. Further, it is confirmed that iridium is able to be separated from the solution containing aluminum deriving from Alq$_3$ and iridium deriving from [Ir(Fdpq)$_2$(acac)] as metal elements by the above method.

This application is based on Japanese Patent Application serial no. 2006-308730 filed with Japan Patent office on Nov. 15, 2006, the entire contents of which are hereby incorporated by reference.

EXPLANATION OF REFERENCE

201: substrate, 202: first electrode, 203: EL layer, and 204: second electrode.

The invention claimed is:

1. A method for collecting a metal from a light-emitting element which has an EL layer comprising an organic metal compound of the metal between a pair of electrodes, the method comprising the steps of:
    exposing the EL layer by detaching one of the pair of electrodes from the light-emitting element;
    treating the EL layer with a solvent to form a solution or a mixture of the organic metal compound;
    heating the solution or the mixture at a temperature higher than 800° C. under an oxygen atmosphere to ash the organic metal compound; and
    collecting the metal as a metal oxide which is obtained by the ashing,
    wherein the metal is iridium or platinum.

2. The method for collecting the metal according to claim 1, further comprising the step of:
    treating the metal oxide with acid water to form a second solution in which the metal oxide is dissolved.

3. The method for collecting the metal according to claim 1, further comprising the steps of:

treating the metal oxide with acid water to form a second solution in which the metal oxide is dissolved; and electrolyzing the second solution.

4. The method for collecting the metal according to claim 1, further comprising the steps of:

treating the metal oxide with acid water to form a second solution in which the metal oxide is dissolved; and reacting the metal contained in the second solution with an organic ligand to form a metal complex.

5. The method for collecting the metal according to claim 1, further comprising the steps of:

treating the metal oxide with acid water to form a second solution in which the metal oxide is dissolved;

reacting the metal contained in the second solution with an organic ligand to form a metal complex; and extracting the metal complex using a solvent.

6. The method for collecting the metal according to claim 1, further comprising:

treating the metal oxide with acid water to fowl a second solution in which the metal oxide is dissolved, wherein the acid water contains a substance selected from hydrogen chloride, hydrogen bromide, hydrogen fluoride, and hydrogen iodide.

7. A method for collecting a metal from a light-emitting element which has an EL layer comprising an organic metal compound of the metal between a pair of electrodes, the method comprising the steps of:

heating the EL layer at a temperature higher than 800° C. under an atmosphere containing oxygen to form an oxide of the metal; and collecting the metal as the oxide of the metal, wherein the metal is iridium or platinum.

8. The method according to claim 7, further comprising:

treating the oxide of the metal with acid water to form a solution in which the oxide of the metal is dissolved.

9. The method according to claim 7, further comprising:

treating the oxide of the metal with acid water to form a solution in which the oxide of the metal is dissolved; and electrolyzing the solution.

10. The method according to claim 9, wherein the acid water contains a substance selected from hydrogen chloride, hydrogen bromide, hydrogen fluoride, and hydrogen iodide.

11. The method according to claim 7, further comprising:

treating the oxide of the metal with acid water to form a solution in which the oxide of the metal is dissolved; and reacting the oxide of the metal with an organic ligand to form a metal complex.

12. The method according to claim 7, further comprising:

treating the oxide of the metal with acid water to form a solution in which the oxide of the metal is dissolved; and reacting the oxide of the metal with an organic ligand to form a metal complex; and extracting the metal complex using a solvent.

* * * * *